(12) United States Patent
Fitzgerald

(10) Patent No.: US 6,750,130 B1
(45) Date of Patent: Jun. 15, 2004

(54) HETEROINTEGRATION OF MATERIALS USING DEPOSITION AND BONDING

(75) Inventor: Eugene A. Fitzgerald, Windham, NH (US)

(73) Assignee: AmberWave Systems Corporation, Salem, NH (US)

(*) Notice: Subject to any disclaimer, the term of this patent is extended or adjusted under 35 U.S.C. 154(b) by 0 days.

(21) Appl. No.: 09/764,177

(22) Filed: Jan. 17, 2001

Related U.S. Application Data (60) Provisional application No. 60/177,084, filed on Jan. 20, 2000.

(51) Int. Cl.[7] .............................................. H01L 21/28
(52) U.S. Cl. ..................... 438/607; 438/602; 438/933
(58) Field of Search ................... 438/455, 604, 438/607, 618, 652, 692

(56) References Cited

U.S. PATENT DOCUMENTS

| | | | |
|---|---|---|---|
| 4,010,045 A | * 3/1977 | Ruehrwein | ................... 148/174 |
| 5,013,681 A | 5/1991 | Godbey et al. | |
| 5,166,084 A | 11/1992 | Pfiester | |
| 5,202,284 A | 4/1993 | Kamins et al. | |
| 5,207,864 A | 5/1993 | Bhat et al. | ................... 156/633 |
| 5,208,182 A | 5/1993 | Narayan et al. | |
| 5,212,110 A | 5/1993 | Pfiester et al. | |
| 5,221,413 A | 6/1993 | Brasen et al. | |
| 5,285,086 A | 2/1994 | Fitzgerald, Jr. | |

(List continued on next page.)

FOREIGN PATENT DOCUMENTS

| | | |
|---|---|---|
| EP | 0 587 520 | 3/1994 |
| EP | 0 683 522 | 11/1995 |
| EP | 0 828 296 | 3/1998 |
| JP | 2000-31491 | 1/2000 |
| JP | 2001319935 | 11/2001 |
| WO | WO 98/59365 | 12/1998 |
| WO | WO 99/53539 | 10/1999 |
| WO | WO 00/48239 | 8/2000 |
| WO | WO 01/54202 | 7/2001 |
| WO | WO 01/99169 A2 | 12/2001 |
| WO | WO 02/15244 A2 | 2/2002 |
| WO | WO 02/27783 A1 | 4/2002 |
| WO | WO 02/071495 A1 | 9/2002 |
| WO | WO 02/082514 A1 | 10/2002 |

OTHER PUBLICATIONS

IBM Technical Disclosure Bulletin, vol. 32, No. 8A, Jan. 1990, "Optimal Growth Technique and Structure for Strain Relaxation of Si–Ge Layers on Si Substrates", pp. 330–331.

Maszara, "Silicon–On–Insulator by Wafer Bonding: A Review," *Journal of the Electrochemical Society*, No. 1 (Jan. 1991) pp. 341–347.

Chang et al., "Selective Etching of SiGe/Si Heterostructures," *Journal of the Electrochemical Society*, No. 1 (Jan. 1991) pp. 202–204.

(List continued on next page.)

*Primary Examiner*—Amir Zarabian
*Assistant Examiner*—Pamela E Perkins
(74) *Attorney, Agent, or Firm*—Testa, Hurwitz & Thibeault, LLP (57) ABSTRACT

A semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In another embodiment, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

39 Claims, 7 Drawing Sheets

U.S. PATENT DOCUMENTS

| | | | |
|---|---|---|---|
| 5,310,451 A | 5/1994 | Tejwani et al. | |
| 5,346,848 A | 9/1994 | Grupen-Shemansky et al. | 437/61 |
| 5,374,564 A | 12/1994 | Bruel | 437/24 |
| 5,413,679 A | 5/1995 | Godbey | |
| 5,439,843 A * | 8/1995 | Sakaguchi et al. | 437/71 |
| 5,442,205 A | 8/1995 | Brasen et al. | |
| 5,461,243 A | 10/1995 | Ek et al. | |
| 5,462,883 A | 10/1995 | Dennard et al. | |
| 5,476,813 A | 12/1995 | Naruse | |
| 5,484,664 A | 1/1996 | Kitahara et al. | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,683,934 A | 11/1997 | Candelaria | |
| 5,728,623 A * | 3/1998 | Mori | 438/455 |
| 5,759,898 A | 6/1998 | Ek et al. | |
| 5,792,679 A | 8/1998 | Nakato | |
| 5,877,070 A | 3/1999 | Goesele et al. | 438/458 |
| 5,891,769 A | 4/1999 | Liaw et al. | |
| 5,906,708 A | 5/1999 | Robinson et al. | |
| 5,906,951 A | 5/1999 | Chu et al. | |
| 5,943,560 A | 8/1999 | Chang et al. | |
| 5,966,622 A | 10/1999 | Levine et al. | 438/459 |
| 5,998,807 A | 12/1999 | Lustig et al. | |
| 6,033,974 A | 3/2000 | Henley et al. | |
| 6,033,995 A * | 3/2000 | Muller | 438/749 |
| 6,059,895 A * | 5/2000 | Chu et al. | 148/33.1 |
| 6,074,919 A | 6/2000 | Gardner et al. | |
| 6,096,590 A | 8/2000 | Chan et al. | |
| 6,103,559 A | 8/2000 | Gardner et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,153,495 A | 11/2000 | Kub et al. | |
| 6,154,475 A | 11/2000 | Soref et al. | |
| 6,162,688 A | 12/2000 | Gardner et al. | |
| 6,184,111 B1 | 2/2001 | Henley et al. | |
| 6,191,007 B1 * | 2/2001 | Matsui et al. | 438/459 |
| 6,191,432 B1 | 2/2001 | Sugiyama et al. | |
| 6,194,722 B1 | 2/2001 | Fiorini et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,235,567 B1 | 5/2001 | Huang | |
| 6,251,755 B1 | 6/2001 | Furukawa et al. | |
| 6,261,929 B1 | 7/2001 | Gehrke et al. | |
| 6,291,321 B1 | 9/2001 | Fitzgerald | |
| 6,313,016 B1 | 11/2001 | Kibbel et al. | |
| 6,323,108 B1 | 11/2001 | Kub et al. | |
| 6,329,063 B2 * | 12/2001 | Lo et al. | 428/450 |
| 6,335,546 B1 * | 1/2002 | Tsuda et al. | 257/94 |
| 6,350,993 B1 | 2/2002 | Chu et al. | |
| 6,368,733 B1 | 4/2002 | Nishinaga | |
| 6,372,356 B1 | 4/2002 | Thornton et al. | |
| 2001/0003269 A1 | 6/2001 | Wu et al. | |
| 2003/0003679 A1 | 1/2003 | Doyle et al. | |

OTHER PUBLICATIONS

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811–813.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994) pp. 493–496.

Bruel, "Silicon on Insulator Material Technology," *Electronic Letters*, vol. 13, No. 14 (Jul. 6, 1995) pp. 1201–1202.

Bruel et al., "RSMART CUT: A Promising New SOI Material Technology," *Proceedings 1995 IEEE International SOI Conference* (Oct. 1995) pp. 178–179.

Ismail, "Si/SiGe High–Speed Field–Effect Transistors," *Electron Devices Meeting, Washington, D.C.* (Dec. 10, 1995) pp. 20.1.1–20.1.4.

Sadek et al., "Design of Si/SiGe Heterojunction Complementary Metal–Oxide–Semiconductor Transistors," *IEEE Trans. Electron Devices* (Aug. 1996) pp. 1224–1232.

Usami et al., "Spectroscopic study of Si–based quantum wells with neighboring confinement structure," *Semicon. Sci. Technol.* (1997) (abstract).

König et al., "Design Rules for n–Type SiGe Hetero FETs," *Solid State Electronics*, vol. 41, No. 10 (1997) pp. 1541–1547.

Ishikawa et al., "Creation of Si–Ge–based SIMOX structures by low energy oxygen implantation," *Proceedings 1997 IEEE International SOI Conference* (Oct. 1997) pp. 16–17.

Maiti et al., "Strained–Si heterostructure field effect transistors," *Semicond. Sci. Technol.*, vol. 13 (1998) pp. 1225–1246.

Borenstein et al., "A New Ultra–Hard Etch–Stop Layer for High Precision Micromachining," *Proceedings of the 1999 12th IEEE International Conference on Micro Electro Mechanical Systems (MEMs)* (Jan. 17–21, 1999) pp. 205–210.

Ishikawa et al., "SiGe–on–insulator substrate using SiGe alloy grow Si(001)," *Applied Physics Letters*, vol. 75, No. 7 (Aug. 16, 1999) pp. 983–985.

Mizuno et al., "Electron and Hole Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Yeo et al., "Nanoscale Ultra–Thin Body Silicon–on–Insulator P–MOSFET with a SiGe/Si Heterostructure Channel," *IEEE Electron Device Letters*, vol. 21, No. 4 (Apr. 2000) pp. 161–163.

Huang et al., "High–quality strain–relaxed SiGe alloy grown on implanted silicon–on–insulator substrate," *Applied Physics Letters*, vol. 76, No. 19 (May 8, 2000) pp. 2680–2682.

Hackbarth et al., "Alternatives to thick MBE–grown relaxed SiGe buffers," *Thin Solid Films*, vol. 369, No. 1–2 (Jul. 2000) pp. 148–151.

Barradas et al., "RBS analysis of MBE–grown SiGe/(001) Si heterostructures with thin, high Ge content SiGe channels for HMOS transistors," *Modern Physics Letters B* (2001) (abstract).

"Relaxed $Ge_xSi_{1-x}$ structures for III–V integration with Si and high mobility two–dimensional electron gases in Si"; by Fitzgerald et al.; AT&T Bell Laboratories, Murray Hill, NJ 07974; 1992 American Vacuum Society; pp.> 1807–1819.

"Demonstration of a GaAs–Based Complian Substrate Using Wafer Bonding and Substrate Removal Techniques"; by Zhang et al.; Electronic Materials and Processing Research Laboratory, Department of Electrical Engineering, University Park, PA 16802; pp. 25–28.

U.S. patent application Ser. No. 09/289,514, Wu et al., filed Apr. 9, 1999.

U.S. patent application Ser. No. 09/599,260, Wu et al., filed Jun. 22, 2000.

U.S. patent application Ser. No. 09/198,960, Fitzgerald et al., filed Nov. 24, 1998.

* cited by examiner

HETEROINTEGRATION OF MATERIALS USING DEPOSITION AND BONDING

PRIORITY INFORMATION

This application claims priority from provisional application Ser. No. 60/177,084 filed Jan. 20, 2000.

BACKGROUND OF THE INVENTION

The invention relates to the field of heterointegration of materials using deposition and bonding.

The goal of combining different materials on a common substrate is desirable for a variety of integrated systems. Specifically, it has been a long-standing desire to combine different semiconductor and oxide materials on a common useful substrate such as a silicon substrate. However, just as the different materials properties are beneficial from the system application perspective, other properties make such materials combinations problematic in processing.

For example, semiconductor materials with different properties often have different lattice constants. Therefore, deposition of one semiconductor material on top of another substrate material results in many defects in the semiconductor layer, rendering it useless for practical application. Another method of integrating materials is through the use of wafer bonding. The bonding process removes the lattice mismatch problem. However, this problem is replaced with a mismatch in thermal expansion. Due to the different thermal expansion coefficients in the bonded materials, the materials cannot be subsequently processed or annealed at optimum temperatures without inducing material degradation (i.e. greater residual stress or introduction of dislocations). A final issue is that due to the different material properties, the bulk crystal materials are often different size (boule diameter). This disparity is undesirable for wafer bonding since only a portion of the composite is useful for device/system fabrication.

SUMMARY OF THE INVENTION

Accordingly, the invention provides a semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In an exemplary embodiment, the epitaxial layer is a segment of a previously fabricated layered structure including the second substrate with a compositionally graded layer and the epitaxial layer provided thereon. The second substrate and the graded layer are removed subsequent to the layered structure being bonded to the first substrate.

In accordance with another exemplary embodiment of the invention, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

DETAILED DESCRIPTION OF THE INVENTION

The invention involves a semiconductor structure and a method of producing a thin, low dislocation density, epitaxial film directly on a lattice mismatched substrate. A thin layer of a material can be deposited on a substrate including a different material using a graded layer to taper any materials properties difference. The graded composition layer often poses a limit to many applications, since the graded layer possesses many dislocations and is quite thick relative to other epitaxial layers and to typical step-heights in CMOS processes. However, if the surface of the deposited semiconductor material is relatively free of defects, the surface can be bonded to another substrate. Subsequently, the original substrate and graded layer can be removed to produce an integrated layer on the desired substrate without the graded region.

Three semiconductor substrates dominate the substrate market: Si, GaAs, and InP. The volumes and diameters of the wafers scale accordingly: Si has the largest wafer size (8 inch, moving to 12 inch) and volumes, GaAs is the next largest (4 inch, moving to 6 inch diameter), and InP trails with the smallest volumes and wafer size (2 inch, moving to 3 and 4 inch). The lattice constant of the substrate increases from Si to GaAs to InP, and the mechanical strength decreases with increasing lattice constant. Thus, Si is the easiest crystal to grow to large diameter with great perfection, whereas InP is the most difficult of the three.

Although the mechanical strength was one of the many reasons that Si began as the favored substrate, the ability to make metal-oxide-semiconductor field-effect-transistors (MOSFETs) allowed markets, chip size, and wafer size to grow rapidly, installing an infrastructure world-wide that continues to make Si the low-cost platform for microelectronics. GaAs and InP are useful in some electronics applications; however, their markets are primarily driven by optoelectronics. Integrating GaAs or InP devices on a Si substrate has tremendous advantages since it allows for the integration of Si electronics with optical devices. However, due to the discrepancy in wafer diameters, a straight bonding process results in only a portion of the Si wafer being covered with GaAs or InP. Because the wafer size difference involves both market size and technology issues, it is a significant barrier to the successful integration of III–V materials with Si using wafer bonding.

Figure 1:
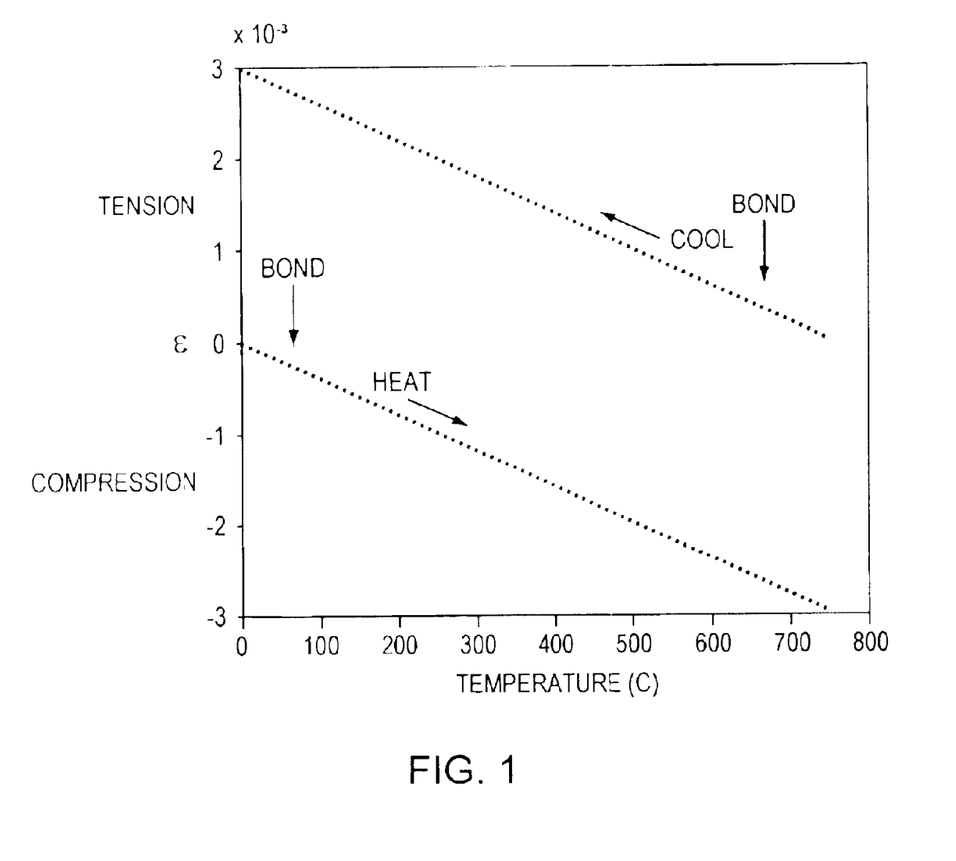
FIG. 1 is a graph showing the strain induced when a 500 μm thick GaAs wafer and a 500 μm thick Si wafer are bonded at room temperature and annealed at high temperature, and bonded at high temperature and cooled to room temperature.

The other issue in question is the thermal expansion difference between the substrate materials being bonded. FIG. 1 is a plot of the strain developed if a GaAs wafer and a Si wafer (each 500 µm thick) are brought in contact at room temperature and heated for bonding, as well as the case where the wafers are bonded at high temperature and cooled down to room temperature. The strains are approximate, using only the linear term in the thermal expansion of the lattice with temperature. Note that if the wafers are bonded at room temperature and heated, a significant strain develops in the bonded pair. This strain can either crack the assembly, or simply cause the wafers to debond. The additional driving force for debonding can be calculated using the Stoney formula, which describes the curvature of a composite structure like the two bonded wafers:

$$\left(\frac{d_f + d_s}{2}\right) F_f = \frac{w}{12R}[Y_f d_f^3 + Y_s d_s^3]$$

where $d_s$ is the thickness of the substrate, $d_f$ is the thickness of the film, $F_f$ is the force on the film, w is the width of the film and substrate, R is the radius of curvature, $Y_f$ is the biaxial modulus of the film, and $Y_s$ is the biaxial modulus of the substrate.

If the substrate and film have an equal thickness of 500 µm (d=$d_s$=$d_f$), the formula simplifies to:

$$R = \frac{d}{12\varepsilon}\left[1 + \frac{Y_{Si}}{Y_{GaAs}}\right].$$

Figure 2:
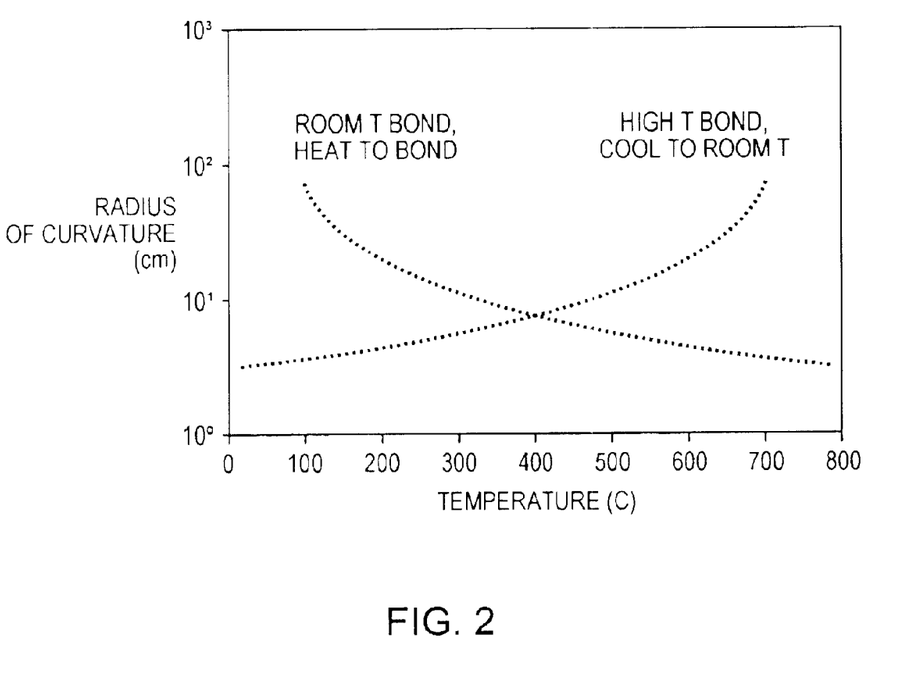
FIG. 2 is a graph showing the curvature induced when a 500 μm thick GaAs wafer and a 500 μm thick Si wafer are bonded under two conditions: bonding at room temperature and subsequently annealing at high temperature anneal, and bonding at high temperature and subsequently cooling to room temperature.
Figure 3A:
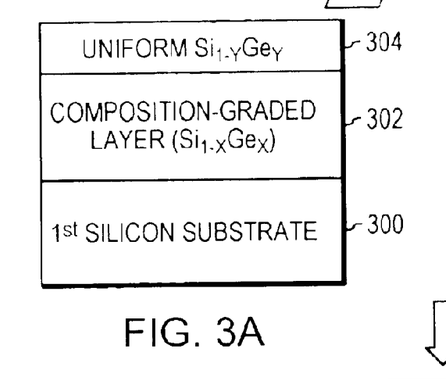
FIGS. 3A–3D are a process flow block diagram for producing a high quality SiGe layer on Si without the presence of a graded buffer layer using wafer bonding and substrate removal.
Figure 3B:
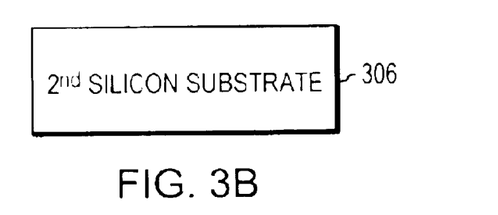
Figure 3C:
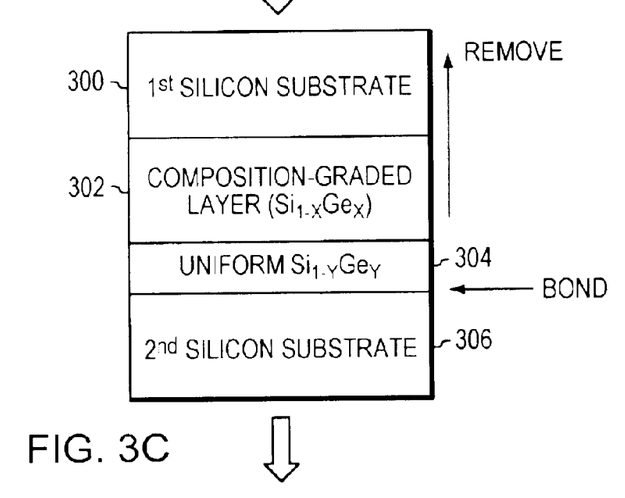
Figure 3D:
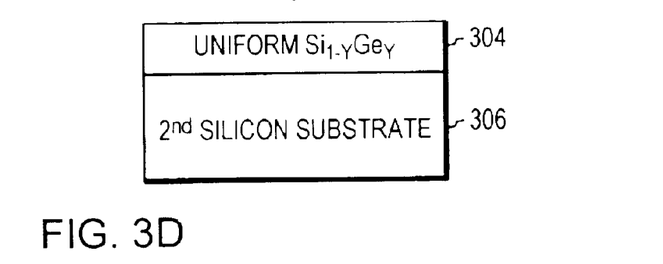
Figure 4A:
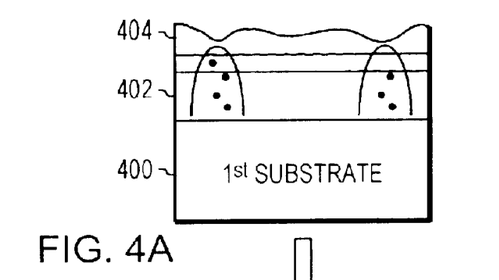
FIGS. 4A–4D are a process flow block diagram showing planarization steps used to improve the surface quality before bonding or after substrate removal.
Figure 4B:
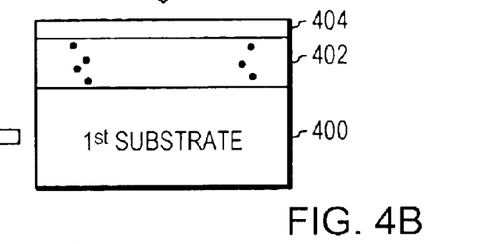
Figure 4C:
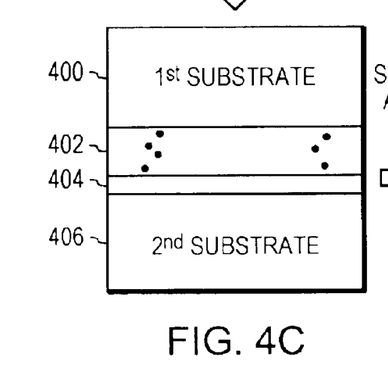
Figure 4D:
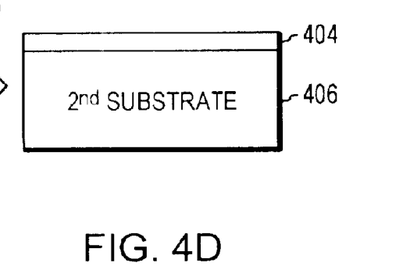
Figures 5A, 5B, 5C, 5D, 5E, 5F:
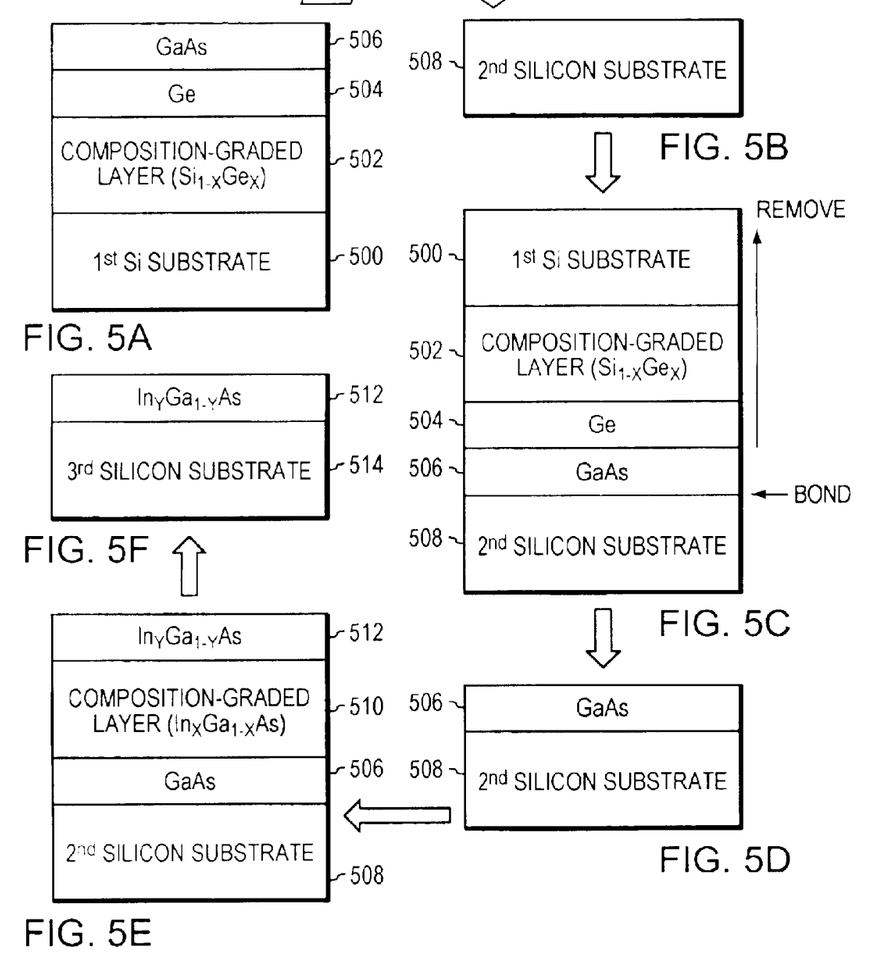
FIGS. 5A–5F are a process flow block diagram for producing a high quality InGaAs layer directly on Si by iterating the graded layer bonding process.

FIG. 2 is a plot of the curvature of the substrate composite of a GaAs wafer bonded to a Si wafer, for the case of bonding at room temperature and heating, as well as bonding at high temperature and cooling. In the case of bonding at room temperature and heating, the combination of the strain shown in FIG. 1 and the resulting curvature shown in FIG. 2 leads to debonding. In the case of bonding at high temperature, the bonding is very strong, and therefore the substrate composite at room temperature is curved, rendering the material useless in most fabrication facilities, especially Si CMOS facilities, where wafer flatness is very important for compatibility with processing equipment. In addition, the substrate composite contains enough strain energy that it is energetically feasible to introduce cracks, and thus the composite tends to fracture spontaneously or with slight mechanical abrasion.

In order to understand how the current invention circumvents the two issues described, the case of integrating a Ge layer or GaAs layer onto a crystalline Si substrate will now be described. FIGS. 3A–3D are a process flow block diagram for producing a high quality SiGe layer on Si without the presence of a graded buffer layer using wafer bonding and substrate removal in accordance with an exemplary embodiment of the invention.

Initially, a graded layer 302 of SiGe is provided on a Si substrate 300 to produce the desired lattice constant with a minimal number of threading dislocations at the top surface. For a review of this process, see E. A. Fitzgerald et al., J. Vac. Sci. and Tech. B 10, 1807 (1992), incorporated herein by reference. Through this process, a uniform SiGe layer 304 is produced at the surface of the structure, even though a silicon substrate exists below. The Ge concentration in this $Si_{1-x}Ge_x$ virtual substrate can range from 0.5–100% (0.005<x<1). The SiGe surface is then bonded to a second silicon wafer 306, or, if the graded layer is graded to pure Ge, a Ge or GaAs layer deposited on the Ge can be bonded to the silicon wafer. Whatever the surface layer composition, the original substrate 300 (on which the graded layer was deposited) as well as the graded layer 302 are then removed, producing a relaxed novel material directly on silicon.

Although compositional grading allows control of the surface material quality, strain fields due to misfit dislocations in the graded layer can lead to roughness at the surface of the epitaxial layer. This roughness poses a problem for wafer bonding, where smooth surfaces are required for strong, uniform bonded interfaces. Implementation of a planarization technique, such as chemomechanical polishing (CMP), before bonding will eliminate this surface roughness and thus enable high quality bonds.

FIGS. 4A–4D are a process flow block diagram showing planarization steps used to improve the surface quality before bonding or after substrate removal. Initially, a graded layer 402 is provided on a substrate 400 to produce the desired lattice constant with a minimal number of threading dislocations at the top surface. A uniform epitaxial layer 404 for transfer is produced at the surface of the structure. The surface of the epitaxial layer 404 is then planarized so it can be bonded to a second substrate 406. The original substrate 400 (on which the graded layer was deposited) as well as the graded layer 402 are then removed, resulting in a relaxed material directly on the second substrate.

Additionally, planarization techniques can be used on the relaxed layer after the original substrate and graded layer are removed. This step is useful if the substrate removal produces a rough surface (as in delamination techniques).

The practical success of the invention is that the thermal expansion coefficient of the two substrate materials are similar or identical, and the wafers are of the same diameter. Thus, the graded layer method of creating a virtual substrate material on top of silicon removes the two constraints that have prevented wafer bonding from effectively producing large areas of heterogeneously integrated materials. With this technique, GaAs, Ge, and any concentration of SiGe can be integrated on Si without the presence of thick graded layers.

It is important to note that although the wafer composite is guaranteed to be nearly flat due to the two substrates being identical material, the epitaxial layers have different thermal expansion coefficients than the substrates and thus experience a large stress and strain. If the thermally induced strain is high enough, it is possible to cause further relaxation of the epitaxial layers. In principle, this relaxation can be benign. For example, if the strain level is great enough to command threading dislocation motion at a given temperature, but the strain level is low enough that the nucleation of new dislocations is not encouraged, then no negative effect will be encountered.

This level of strain can be beneficial. If patterns have been etched in the epitaxial layers before bonding, the threading dislocation motion created by the strain moves the threading dislocations to the pattern edges, thus lowering the effective threading dislocation density at the top surface of the epitaxial layers. However, too high a strain level due to excessive heating of the bonded composite will nucleate new dislocations, increasing the threading dislocation density in the epitaxial layer. A guideline for defining the excess strain level for dislocation nucleation can be gleaned from the known experimental data in a myriad of lattice-mismatched semiconductor systems. For lattice mismatches near 1% or less, the threading dislocation density is usually less than $10^7$ cm$^{-2}$, and thus may not increase the threading dislocation density over the level already present in the layers ($10^5$–$10^6$ cm$^{-2}$). For greater than approximately 1–1.5% strain, the threading dislocation density in relaxed material is quite high. Thus, the objective is to not let the strain in the sandwiched epitaxial layer approach 1% in order to minimize the chance for increased threading dislocation density.

The synergy of combining the graded layer and bonding methods extends beyond the embodiments described. For example, the process can be repeated multiple times, and the process remains economical since inexpensive Si wafers are used for the original host wafers. FIG. 5A–5F are a process flow block diagram for producing a high quality InGaAs layer directly on Si by iterating the graded layer bonding process. Multiple process iterations can be used to integrate InGaAs alloys on Si. In order to produce InGaAs on Si with only compositional grading, a Si substrate 500 is graded from Si to a pure Ge layer 504 using a SiGe grading layer 502, and subsequently graded from GaAs to InGaAs by depositing a GaAs layer 506 and grading the In composition with a graded layer 510. However, for high In concentrations, a thick region of graded InGaAs is needed to keep the threading dislocation density low at the surface. This great thickness results in cracking upon cooling from the growth temperature.

The invention can be used to first create a thin layer of GaAs 506 on a Si substrate 508 in which the Ge 504 and SiGe 502 graded layers have been removed. Subsequently, In can be compositionally graded to achieve the desired InGaAs layer 512. The fact that the SiGe and Ge are removed allows for the grading of thicker InGaAs layers, since Ge has a similar thermal expansion coefficient as the III–V materials. If the graded InGaAs layer were undesirable in a particular application, then the process can be repeated to produce InGaAs directly on a Si substrate 514. If the In concentration in the graded layer 510 is graded to near 50% In, then this method can be used for creating InP layers on Si, useful for optoelectronic integration of $\lambda = 1.55$ $\mu$m devices with Si electronics.

It will be appreciated that a thin Ge or III–V material layer on Si can be created with the process shown in FIGS. 5A–5F. These materials are very useful in fabricating optoelectronic integrated circuits (OEICs) on Si. The thin layer might be Ge or GaAs or In$_{0.5}$Ga$_{0.5}$P after SiGe grading, or may also be InGaAs or InP after InGaAs grading. Essentially, by utilizing either one or multiple bonding sequences, thin layers of Si$_{1-t}$Ge$_t$, Al$_v$(In$_w$Ga$_{1-w}$)$_{1-v}$As, or (In$_x$Ga$_{1-x}$)$_z$(As$_{1-y}$P$_y$)$_{1-z}$ can be produced on a mismatched substrate where $0.005<t<1$, $0<v<1$, $0<w<1$, $0<x<1$, $0<y<1$, and $0<z<1$. These thin layers are removed from the areas where Si electronics are to be fabricated using standard photolithography. The remaining areas containing the thin material for optoelectronics are protected with a SiO$_2$ layer or other material during Si circuit processing. After substantial Si circuit processing, removing the SiO$_2$ exposes the thin optoelectronic areas, and subsequently optoelectronic devices are fabricated.

An advantageous feature of the invention is the ability to integrate a thin layer. After removal of the original wafer and graded layer, only a thin layer of the thermally mismatched material is present. Thus, the thin film on thick substrate approximation holds:

$$R = \frac{1}{6\varepsilon_f}\left(\frac{Y_s}{Y_f}\right)\frac{d_s^2}{d_f}.$$

For a thin film of 0.1 $\mu$m GaAs on a 500 $\mu$m Si substrate, the radius of curvature is always much greater than $10^4$ cm for the temperature range of room T to 750C for the structure. Such a small amount of curvature will not affect most processing. However, if there is a need to remove this small curvature, other epitaxial layers and/or layers on the backside of the wafer can be deposited to easily compensate for the strain, leading to wafers with less curvature.

Figure 6:
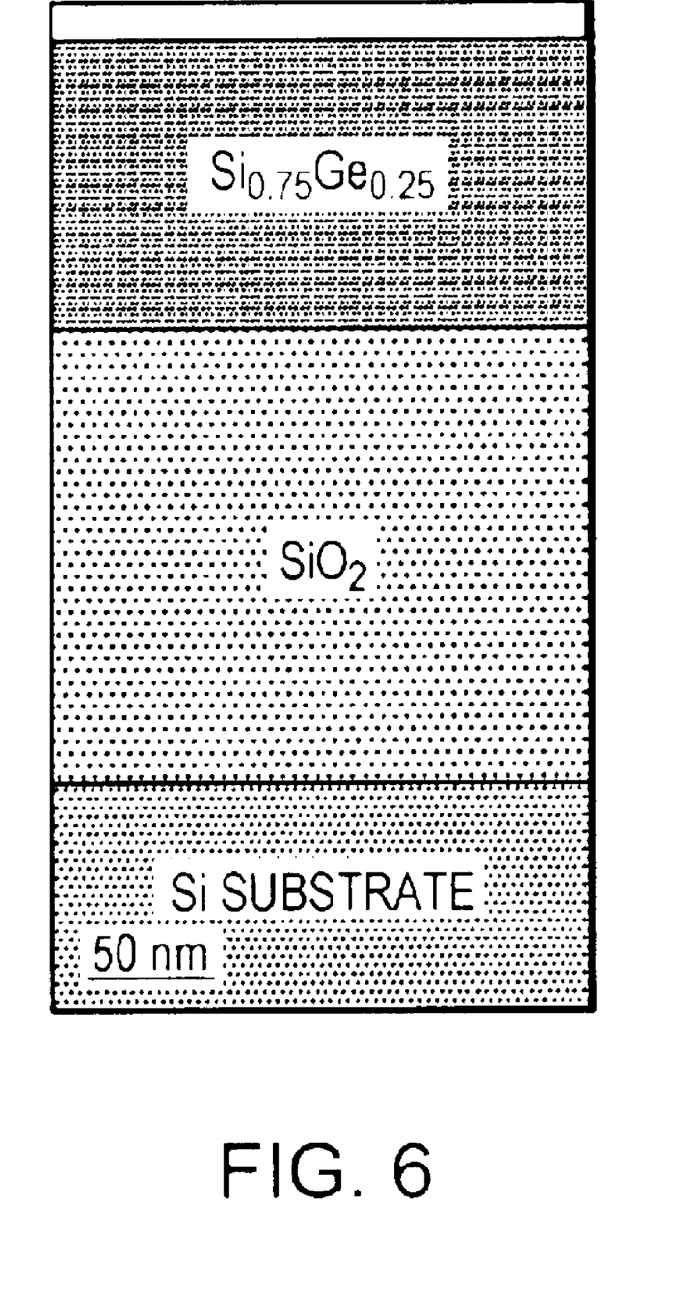
FIG. 6 is a cross-sectional transmission electron micrograph of a relaxed, low dislocation density SiGe film on an oxidized substrate.
Figure 7A:
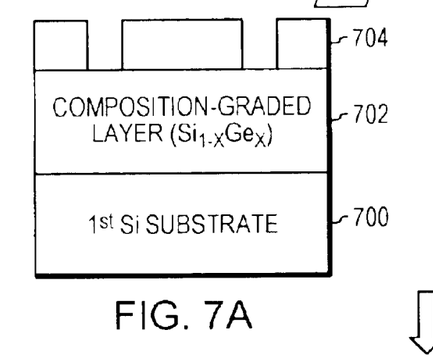
FIGS. 7A–7D are a process flow block diagram for producing high quality mismatched epitaxial layers directly on Si using patterned trenches in the epitaxial layer as a sink for dislocations and for strain relief.
Figure 7B:
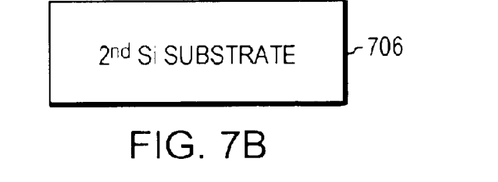
Figure 7C:
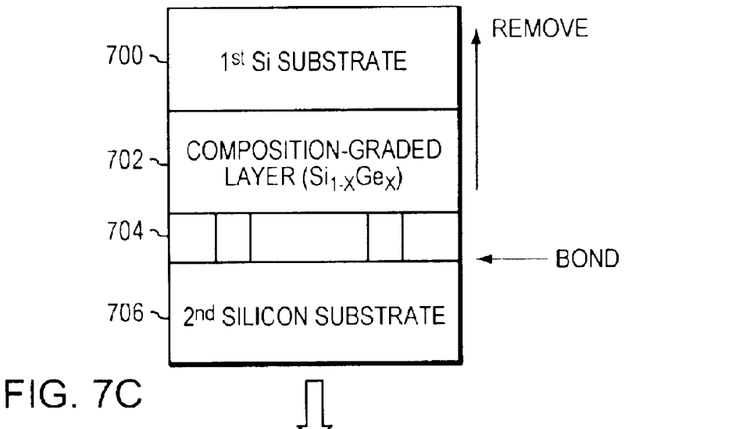
Figure 7D:
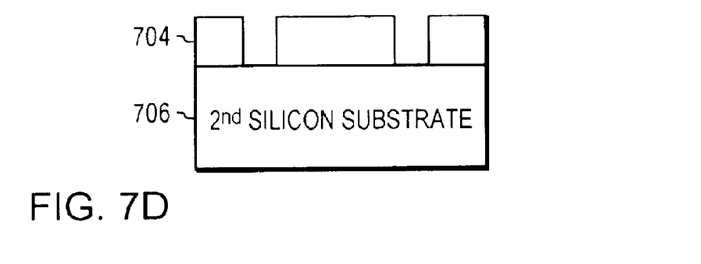

All of the provided examples exemplify semiconductor/semiconductor bonding. However, other materials present on the wafer surface can be present as well and included by bonding into the structure. For example, instead of bonding only to bare Si surfaces, the epitaxial wafer can be bonded to a Si wafer coated with SiO$_2$. Using the process described, a thin GaAs/SiO$_2$/Si structure is created, which is very useful for optical interconnects. The SiO$_2$ layer allows for both optical and electronic isolation of the top optoelectronic layer. An example of bonding a relaxed SiGe alloy on Si to SiO$_2$/Si is shown in FIG. 6. FIG. 6 is a cross-section transmission electron micrograph of an exemplary SiGe/SiO$_2$/Si structure. The process used to create the material is the same as shown in FIGS. 3A–3D, except the SiGe has been bonded to a Si wafer with SiO$_2$ on its surface.

In addition, in an alternative exemplary embodiment of the invention, a structure can be fabricated in accordance with the previously described process in which the epitaxial layer is eventually applied to a glass substrate rather than a Si substrate. The glass substrate would need to have a thermal expansion coefficient that is similar to that of the substrate on which the epitaxial layer is deposited, e.g., Si.

FIGS. 7A–7D are a process flow block diagram for producing high quality mismatched epitaxial layers directly on Si using patterned trenches in the epitaxial layer as a sink for dislocations and for strain relief in accordance with an alternative exemplary embodiment of the invention. A graded layer 702, e.g., SiGe, Ge or GaAs, is provided on a first Si substrate 700. This layer is graded until a uniform layer 704 is produced. The uniform layer 704 is then patterned with vias and/or trenches before the bonding process. A second Si substrate is bonded to the uniform layer 704. Subsequently, the first Si substrate 700 and the graded layer 702 are removed resulting in a uniform layer, e.g., Si$_{1-y}$Ge$_y$, provided directly on a Si substrate.

In this way, tensile stress in the original graded structure is relieved, aiding the bonding operation. This variant also produces a flat structure with isolated patterns after release. For example, an array of trenches produces a series of mesas on the surface, and after bonding and removal, these mesas are areas of isolated, relaxed layers. In this embodiment, the epitaxial layer will not contribute to thermal bowing of the new structure. Additionally, since these mesas are isolated, the edges of the mesas act as sinks for dislocations, and thus thermal cycling of the material further reduces the threading dislocation density.

In all of the above processes, there are various ways of removing the graded layer/original substrate. One method is the well-known etch-back process, where the substrate is physically ground until quite thin, and then a chemical etch is used to stop at a particular layer. Another technique is the hydrogen-implant technique, in which a high dose of hydrogen is implanted below the surface of the layer to be released (in this case, the surface of the original substrate plus graded layer and uniform layer). After bonding, it is possible to fracture the implanted region, removing the original graded layer and substrate, and leaving the desired transferred layer.

Although the present invention has been shown and described with respect to several preferred embodiments thereof, various changes, omissions and additions to the form and detail thereof, may be made therein, without departing from the spirit and scope of the invention.

What is claimed is:

1. A method of processing a semiconductor structure comprising:

providing a first substrate;

providing a layered structure including a second substrate having an epitaxial layer provided thereon, said epitaxial layer having an in-plane lattice constant that is different from that of the first substrate and a threading dislocation density of less than $10^7$ cm$^{-2}$, said first and second substrates having at least one of (i) similar thermal expansion coefficients and (ii) the same lattice constant;

bonding said first substrate to said layered structure; and removing said second substrate.

2. The method of claim 1, wherein the epitaxial layer is planarized prior to bonding to said first substrate.

3. The method of claim 2, wherein the epitaxial layer is planarized by chemomechanical polishing.

4. The method of claim 1, wherein the epitaxial layer is planarized after the second substrate is removed.

5. The method of claim 4, wherein the epitaxial layer is planarized by chemomechanical polishing after the second substrate is removed.

6. The method of claim 1, wherein the first substrate comprises Si.

7. The method of claim 1, wherein the epitaxial layer comprises Si$_{1-x}$Ge$_x$ with 0005<x<1.

8. The method of claim 7, wherein the epitaxial layer is planarized.

9. The method of claim 8, wherein the epitaxial layer is planarized by chemomechanical polishing.

10. The method of claim 8, wherein the first substrate comprises Si.

11. The method of claim 10, wherein the first substrate comprises a surface layer of SiO$_2$.

12. The method of claim 1, wherein the epitaxial layer comprises Al$_y$(In$_x$Ga$_{1-x}$)$_{1-y}$As.

13. The method of claim 12, wherein the epitaxial layer is planarized.

14. The method of claim 12, wherein the epitaxial layer is planarized by chemomechanical polishing.

15. The method of claim 13, wherein the first substrate comprises Si.

16. The method of claim 15, wherein the first substrate comprises a surface layer of SiO$_2$.

17. The method of claim 1, wherein the epitaxial layer comprises In$_x$Ga$_{1-x}$As.

18. The structure of claim 1, wherein the epitaxial layer comprises GaAs.

19. The method of claim 1, wherein the epitaxial layer comprises (In$_x$Ga$_{1-x}$)$_z$(As$_{1-y}$P$_y$)$_{1-z}$.

20. The method of claim 19, wherein the epitaxial layer is planarized.

21. The method of claim 20, wherein the epitaxial layer is planarized by chemomechanical polishing.

22. The method of claim 20, wherein the first substrate comprises Si.

23. The method of claim 22, wherein the first substrate comprises a surface layer of SiO$_2$.

24. The method of claim 1, wherein the epitaxial layer comprises In$_x$Ga$_{1-x}$P.

25. The method of claim 1, wherein the epitaxial layer comprises InP.

26. The method of claim 1, wherein the second substrate comprises a crystalline substrate, a graded composition layer and a threading dislocation density at the surface of said second substrate which is less than $10^7$ cm$^{-2}$.

27. The method of claim 1, wherein said epitaxial layer is patterned with trenches or vias.

28. The method of claim 1, wherein said first substrate comprises an insulating layer.

29. The method of claim 28, wherein the insulating layer comprises SiO$_2$.

30. The method of claim 1, wherein said second substrate comprises an insulating layer.

31. The method of claim 30, wherein said insulating layer is disposed above the epitaxial layer.

32. The method of claim 30, wherein said insulating layer is disposed beneath the epitaxial layer.

33. The method of claim 30, wherein said insulating layer comprises SiO$_2$.

34. A method of processing a semiconductor structure comprising:

providing a first glass substrate;

providing a layered structure including a second substrate having an epitaxial layer provided thereon, said epitaxial layer having an in-plane lattice constant that is different from that of said second substrate and a threading dislocation density of less than $10^7$ cm$^{-2}$;

bonding said first substrate to said epitaxial layer; and removing said second substrate.

35. The method of claim 34, wherein said first glass substrate has a thermal expansion coefficient similar to that of said second substrate.

36. The method of claim 35, wherein the epitaxial layer comprises Si$_{1-x}$Ge$_x$ with 0.005<x<1.

37. The method of claim 35, wherein the epitaxial layer comprises Al$_y$(In$_x$Ga$_{1-x}$)$_{1-y}$As.

38. The method of claim 35, wherein the epitaxial layer comprises (In$_x$Ga$_{1-x}$)$_z$(As$_{1-y}$P$_y$)$_{1-z}$.

39. The method of claim 34, wherein said epitaxial layer is patterned with trenches or vias.

* * * * *

US006750130C1

(12) INTER PARTES REEXAMINATION CERTIFICATE (0069th)
United States Patent
Fitzgerald (10) Number: US 6,750,130 C1
(45) Certificate Issued: May 26, 2009

(54) HETEROINTEGRATION OF MATERIALS USING DEPOSITION AND BONDING

(75) Inventor: Eugene A. Fitzgerald, Windham, NH (US)

(73) Assignee: Amberwave Systems Corporation, Salem, NH (US)

Reexamination Request:
No. 95/000,180, Sep. 28, 2006

Reexamination Certificate for:
Patent No.: 6,750,130
Issued: Jun. 15, 2004
Appl. No.: 09/764,177
Filed: Jan. 17, 2001

Related U.S. Application Data
(60) Provisional application No. 60/177,084, filed on Jan. 20, 2000.

(51) Int. Cl.
*H01L 21/70* (2006.01)
*H01L 21/762* (2006.01)
*C30B 25/02* (2006.01)
*C30B 33/00* (2006.01)
*C30B 33/06* (2006.01)

(52) U.S. Cl. .................. 438/607; 438/602; 438/933; 257/E21.569

(58) Field of Classification Search ................. None
See application file for complete search history.

(56) References Cited

U.S. PATENT DOCUMENTS

| | | | |
|---|---|---|---|
| 2,879,147 A | * | 3/1959 | Baker .................. 216/56 |
| 4,710,788 A | | 12/1987 | Dambkes et al. |
| 4,987,462 A | | 1/1991 | Kim et al. |
| 4,990,979 A | | 2/1991 | Otto et al. |
| 4,997,776 A | | 3/1991 | Harame et al. |
| 5,155,571 A | | 10/1992 | Wang et al. |
| 5,177,583 A | | 1/1993 | Endo et al. |
| 5,241,197 A | | 8/1993 | Murakami et al. |
| 5,250,445 A | | 10/1993 | Bean et al. |
| 5,291,439 A | | 3/1994 | Kauffmann et al. |

(Continued)

FOREIGN PATENT DOCUMENTS

| | | |
|---|---|---|
| DE | 41 01 167 | 7/1992 |
| EP | 0 514 018 | 11/1992 |
| EP | 0 829 908 | 3/1998 |
| EP | 0 838 858 | 4/1998 |
| EP | 1 020 900 | 7/2000 |

(Continued)

OTHER PUBLICATIONS

Yablonovitch, E., "Epitaxial Liftoff Technology," SPIE Optical Enhancements to Computing Technology vol. 1563, pp. 8–9, 1991.

Fitzgerald, E.A., et al., "Relaxed $Ge_xSi_{1-x}$ Structures for III–V Integration with Si and High Mobility Two–Dimensional Electron Gases in Si," J. Vac. Sci. and Tech. B vol. 10, pp. 1807–1819, 1992.

(Continued)

*Primary Examiner*—Erik Kielin (57) ABSTRACT

A semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In another embodiment, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

U.S. PATENT DOCUMENTS

| | | |
|---|---|---|
| 5,298,452 A | 3/1994 | Meyerson |
| 5,316,958 A | 5/1994 | Meyerson |
| 5,399,522 A | 3/1995 | Ohori et al. |
| 5,424,243 A | 6/1995 | Takasaki et al. |
| 5,426,069 A | 6/1995 | Selvakumar et al. |
| 5,426,316 A | 6/1995 | Mohammad |
| 5,461,250 A | 10/1995 | Burghartz et al. |
| 5,479,033 A | 12/1995 | Baca et al. |
| 5,523,243 A | 6/1996 | Mohammad |
| 5,596,527 A | 1/1997 | Tomioka et al. |
| 5,617,351 A | 4/1997 | Bertin et al. |
| 5,630,905 A | 5/1997 | Lynch et al. |
| 5,659,187 A | 8/1997 | Legoues et al. |
| 5,698,869 A | 12/1997 | Yoshimi et al. |
| 5,714,777 A | 2/1998 | Ismail et al. |
| 5,739,567 A | 4/1998 | Wong |
| 5,777,347 A | 7/1998 | Bartelink |
| 5,786,612 A | 7/1998 | Otani et al. |
| 5,786,614 A | 7/1998 | Chuang et al. |
| 5,808,344 A | 9/1998 | Ismail et al. |
| 5,847,419 A | 12/1998 | Imai et al. |
| 5,912,479 A | 6/1999 | Mori et al. |
| 5,963,817 A | 10/1999 | Chu et al. |
| 6,013,134 A | 1/2000 | Chu et al. |
| 6,058,044 A | 5/2000 | Sugiura et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,160,303 A | 12/2000 | Fattaruso |
| 6,204,529 B1 | 3/2001 | Lung et al. |
| 6,232,138 B1 | 5/2001 | Fitzgerald et al. |
| 6,242,324 B1 | 6/2001 | Kub et al. |
| 6,249,022 B1 | 6/2001 | Lin et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,316,301 B1 | 11/2001 | Kant |
| 6,339,232 B1 | 1/2002 | Takagi et al. |
| 6,399,970 B2 | 6/2002 | Kubo et al. |
| 6,403,975 B1 | 6/2002 | Brunner et al. |
| 6,407,406 B1 | 6/2002 | Tezuka et al. |
| 6,425,951 B1 | 7/2002 | Chu et al. |
| 6,429,061 B1 | 8/2002 | Rim |
| 6,540,937 B1 | 4/2003 | Payne et al. |
| 6,555,839 B2 | 4/2003 | Fitzgerald |
| 6,573,126 B2 | 6/2003 | Cheng et al. |
| 6,583,015 B2 | 6/2003 | Fitzgerald et al. |
| 6,593,191 B2 | 7/2003 | Fitzgerald |
| 6,602,613 B1 | 8/2003 | Fitzgerald |
| 6,603,156 B2 | 8/2003 | Rim |
| 6,750,130 B1 | 6/2004 | Fitzgerald |
| 2001/0003364 A1 | 6/2001 | Sugawara et al. |
| 2002/0043660 A1 | 4/2002 | Yamazaki et al. |
| 2002/0052084 A1 | 5/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0168864 A1 | 11/2002 | Cheng et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |
| 2003/0057439 A1 | 3/2003 | Fitzgerald |
| 2003/0077867 A1 | 4/2003 | Fitzgerald |
| 2003/0102498 A1 | 6/2003 | Braithwaite et al. |

FOREIGN PATENT DOCUMENTS

| | | |
|---|---|---|
| EP | 1 174 928 | 1/2002 |
| FR | 2 701 599 | 8/1994 |
| GB | 2 342 777 | 4/2000 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2002-076334 | 3/2002 |
| JP | 2002-164520 | 6/2002 |
| JP | 2002-289533 | 10/2002 |
| WO | WO-00/54338 | 9/2000 |
| WO | WO-01/22482 | 3/2001 |
| WO | WO-01/93338 | 12/2001 |
| WO | WO-02/13262 | 2/2002 |
| WO | WO-02/47168 | 6/2002 |
| WO | WO-02/071488 | 9/2002 |
| WO | WO-02/071491 | 9/2002 |

OTHER PUBLICATIONS

Bruel, M., "Application of Hydrogen Ion Beams to Silicon on Insulator Material Technology," Nucl. Instr. and Meth. in Phys. Res. B, vol. 108, pp. 313–319, 1996.

M.T. Currie et al., "Controlling threading dislocation densities in Ge on Si using graded SiGe layers and chemical–mechanical polishing," Appl. Phys. Lett., 72, No. 14, Apr. 6, 1998, p. 1718.

E.A. Fitzgerald et al., "Nucleation mechanisms and the elimination of misfit dislocations at mismatchedinterfaces by reduction in growth area", J. Appl. Phys., vol. 65, pp. 2220–2237 (1989).

Wang, L.–W., et al., "Electronic structures of [110]–faceted self–assembled pyramidal InAs/GaAs quantum dots", Phys. Rev., B 59, 5678 (1999).

Greenwood, N.N., et al., "Chemistry of the Elements $2^{nd}$ Ed.", p. 331, B.–H., 1997.

"2 Bit/Cell EEPROM Cell Using Band to Band Tunneling for Data Read–Out," 35 IBM Technical Disclosure Bulletin 4B, pp. 136–140 (Sep. 1992).

Armstrong et al., "Design of Si/SiGe Heterojunction Complementary Metal–Oxide–Semiconductor Transistors," 1995 IEDM Tech. Dig., pp. 761–764.

Armstrong, "Technology for SiGe Heterostructure–Based CMOS Devices," PhD Thesis, Massachusetts Institute of Technology, 1999, pp. 1–154.

Augusto et al., "Proposal for a New Process Flow for the Fabrication of Silicon–Based Complementary MOD–MOSFETs without Ion Implantation," Thin Solid Films, vol. 294, No. 1–2, pp. 254–258 (1997).

Bouillon et al., "Search for the optimal channel architecture for 0.18/0.12 μm bulk CMOS experimental study," IEEE (1996), pp. 21.2.1–21.2.4.

Bufler et al., "Hole transport in strained $Si_{1-x}Ge_x$ alloys on $Si_{1-y}Ge_y$ substrates," 84 J. App. Physics 10, pp. 5597–5602 (1998).

Burghartz et al., "Microwave Inductors and Capacitors in Standard Multilevel Interconnect Silicon Technology," 44 IEEE Transactions on Microwave Theory and Techniques 1, pp. 100–104 (1996).

Canaperi et al., "Preparation of a relaxed Si–Ge layer on an insulator in fabricating high–speed semiconductor devices with strained epitaxial films," International Business Machines Corporation, USA (2002), abstract.

Carlin et al., "High Efficiency GaAs–on–Si Solar Cells with High Voc using Graded GeSi Buffers," IEEE—2000, pp. 1006–1011 (2000).

Cheng et al., "Electron Mobility Enhancement in Strained–Si n–MOSFETs Fabricated on SiGe–on–Insulator (SGOI) Substrates," 22 IEEE Electron Device Letters 7, pp. 321–323 (2001).

Cheng et al., "Relaxed Silicon–Germanium on Insulator Substrate by Layer Transfer," 30 J. Electronic Mat. 12, pp. L37–L39 (2001).

Cullis et al., "Growth ripples upon strained SiGe epitaxial layers on Si and misfit dislocation interactions," 12 J. Vacuum Sci. Tech. A, No. 4, pp. 1924–1931 (Jul./Aug. 1994).

Currie et al., "Carrier mobilities and process stability of strained Si n– and p–MOSFETs on SiGe virtual substrates," 19 J. Vacuum Sci. Tech. B, No. 6, pp. 2268–2279 (Nov./Dec. 2001).

Eaglesham et al., "Dislocation–Free Stranski–Krastanow Growth of Ge on Si(100)," 64 Physical Review Letters 16, pp. 1943–1946 (1990).

Fischetti et al., "Brand structure, deformation potentials, and carrier mobility in strained Si, Ge, and SiGe alloys," 80 J. App. Physics 4, pp. 2234–2252 (1996).

Fischetti, "Long–range Coulomb interactions in small Si devices. Part II. Effective electron mobility in thin–oxide structures," 89 J. App. Physics 2, pp. 1232–1250 (2001).

Fitzgerald et al., "Dislocation dynamics in relaxed graded composition semiconductors," Mat. Sci. & Engineering, B67, pp. 53–61 (1999).

Garone et al., "Silicon vapor phase epitaxial growth catalysis by the presence of germane," 56 Applied Physics Letters 13, pp. 1275–1277 (1990).

Gray et al., "Analysis and Design of Analog Integrated Circuits," John Wiley & Sons, 1984, pp. 605–632.

Grützmacher et al., "Ge segregation in SiGe/Si heterostructures and its dependence on deposition technique and growth atmosphere," 63 Applied Physics Letters 18, pp. 2531–2533 (1993).

Hackbarth et al., "Strain relieved SiGe buffers for Si–based heterostructure field–effect transistors," J. Crystal Growth, vol. 201/202 (1999), pp. 734–738.

Herzog et al., "SiGe–based FETs: buffer issues and device results," 380 Thin Solid Films, pp. 36–41 (2000).

Höck et al., "Carrier mobilities in modulation doped $Si_{1-x}Ge_x$ heterostructures with respect to FET applications," 336 Thin Solid Films, pp. 141–144 (1998).

Höck et al., "High hole mobility in $Si_{0.17}Ge_{0.83}$ channel metal–oxide–semiconductor field–effect transistors grown by plasma–enhanced chemical vapor deposition," 76 Applied Physics Letters 26, pp. 3920–3922 (2000).

Höck et al., "High performance 0.25 μm p–type Ge/SiGe MODFETs," 34 Electronics Letters 19, pp. 1888–1889 (1998).

Huang et al., "The Impact of Scaling Down to Deep Submicron on CMOS RF Circuits," 33 IEEE J. Solid–State Circuits 7, pp. 1023–1036 (1998).

Ismail et al., "Modulation–doped n–type Si/SiGe with inverted interface," 65 Applied Physics Letters 10, pp. 1248–1250 (1994).

Kearney et al., "The effect of alloy scattering on the mobility of holes in a $Si_{1-x}Ge_x$ quantum well," 13 Semiconductor Sci. Tech., pp. 174–180 (1998).

Kim et al., "A Fully Integrated 1.9–GHz CMOS Low–Noise Amplifier," 8 IEEE Microwave and Guided Wave Letters 8, pp. 293–295 (1998).

Koester et al., "Extremely High Transconductance Ge/$Si_{0.4}Ge_{0.6}$ p–MODFET's Grown by UHV–CVD," 21 IEEE Electron Device Letters 3, pp. 110–112 (2000).

König et al., "p–Type Ge–Channel MODFET's with High Transconductance Grown on Si Substrates," 14 IEEE Electron Device Letters 4, pp. 205–207 (1993).

König et al., "SiGe HBTs and HFETs," 38 Solid–State Electronics 9, pp. 1595–1602 (1995).

Kubota et al., "New SOI CMOS Process with Selective Oxidation," 1986 IEEE IEDM Tech. Dig., pp. 814–816.

Kummer et al., "Low energy plasma enhanced chemical vapor deposition," Mat. Sci. & Engineering, B89, pp. 288–295 (2002).

Kuznetsov et al., "Technology for high–performance n–channel SiGe modulation–doped field–effect transistors," J. Vacuum Sci. Tech. B, 13(6), pp. 2892–2896 (Nov./Dec. 1995).

Larson, "Integrated Circuit Technology Options for RFIC's–Present Status and Future Directions," 33 IEEE J. Solid–State Circuits 3, pp. 387–399 (1998).

Lee et al., "CMOS RF Integrated Circuits at 5 GHz and Beyond," 88 Proceedings of the IEEE 10, pp. 1560–1571 (2000).

Lee et al., "Strained Ge channel p–type metal–oxide–semiconductor field–effect transistors grown on $Si_{1-x}Ge_x$/Si virtual substrates," 79 Applied Physics Letters 20, pp. 3344–3346 (2001).

Lee et al., "Strained Ge channel p–type MOSFETs fabricated on $Si_{1-x}Ge_x$/Si virtual substrates," 686 Mat. Research Soc'y Symp. Proc., pp. A1.9.1–A1.9.5 (2002).

Leitz et al., "Channel Engineering of SiGe–Based Heterostructures for High Mobility MOSFETs," 686 Mat. Research Soc'y Symp. Proc., pp. A3.10.1–A3.10.6 (2002).

Leitz et al., "Dislocation glide and blocking kinetics in compositionally graded SiGe/Si," 90 J. App. Physics 6, pp. 2730–2736 (2001).

Leitz et al., "Hole mobility enhancements in strained Si/$Si_{1-y}Ge_y$ p–type metal–oxide–semiconductor field–effect transistors grown on relaxed $Si_{1-x}Ge_x$ (x>y) virtual substrates," 79 Applied Physics Letters 25, pp. 4246–4248 (2001).

Li et al., "Design of high speed Si/SiGe heterojunction complementary metal–oxide–semiconductor field effect transistors with reduced short–channel effects," 20 J. Vacuum Sci. & Tech. A, No. 3, pp. 1030–1033 (May/Jun. 2002).

Lu et al., "High Performance 0.1 μm Gate–Length P–Type SiGe MODFET's and MOS–MODFET's," 47 IEEE Transactions on Electron Devices 8, pp. 1645–1652 (2000).

Matsumoto et al., "Study on Bi–CMOS Device Utilising SIMOX Technology," Electronics Letters, vol. 25, pp. 904–905 (1989).

Meyerson et al., "Cooperative Growth Phenomena in Silicon/Germanium Low–Temperature Epitaxy,"53 Applied Physics Letters 25, pp. 2555–2557 (1988).

Mizuno et al., "Advanced SOI–MOSFETs with Strained–Si Channel for High Speed CMOS–Electron/Hole Mobility Enhancement," 2000 Symp. on VLSI Technology, Dig. Tech. Papers, pp. 210–211.

Mizuno et al., "High Performance Strained–Si p–MOSFETs on SiGe–on–Insulator Substrates Fabricated by SIMOX Technology," 1999 IEEE IDEM Tech. Dig., pp. 934–936.

Nayak et al., "High–Mobility Strained–Si PMOSFET's," IEEE Transactions on Electron Devices 10, pp. 1709–1716 (1996).

Office action in Inter Partes Reexamination of U.S. Patent No. 6,703,144, Oct. 26, 2006.

Ota, "Application of heterojunction FET to power amplifier for cellular telephone," 30 Electronic Letters 11, pp. 906–907 (1994).

Papananos, "Radio–Frequency Microelectronic Circuits for Telecommunication Applications," Kluwer Academic Publishers, 1999, pp. 115–117, 188–193.

Parker et al., "SiGe heterostructure CMOS circuits and applications," 43 Solid State Electronics, pp. 1497–1506 (1999).

Pollentier, "Fabrication of a GaAs–AlGaAs GRIN–SCH SQW Laser Diode on Silicon by Epitaxial Lift–Off," 3 IEEE Photonics Technology Letters 2, pp. 115–117 (1991).

Ransom et al., "Gate–Self–Aligned n–channel and p–channel Germanium MOSFET's," 38 IEEE Transactions on Electron Devices 12, pp. 2695 (1991).

Reinking et al., "Fabrication of high–mobility Ge p–channel MOSFETs on Si substrates," 35 Electronics Letters 6, pp. 503–504 (1999).

Request for Inter Partes Reexamination of U.S. Patent No. 6,703,144, Jun. 9, 2006.

Request for Inter Partes Reexamination of U.S. Patent No. 6,602,613, Aug. 22, 2006.

Rim, "Application of Silicon–Based Heterostructures to Enhanced Mobility Metal–Oxide–Semiconductor Field–Effect Transistors," PhD Thesis, Stanford University, 1999, pp. 1–184.

Rim et al., "Enhanced Hole Mobilities in Surface–Channel Strained–Si p–MOSFETs," IEDM (1995), pp. 517–520.

Rim et al., "Fabrication and Analysis of Deep Submicron Strained–Si N–MOSFET's,"47 IEEE Transactions on Electron Devices 7, pp. 1406–1415 (2000).

Robbins et al., "A model for heterogeneous growth of $Si_{1-x}Ge_x$ films from hydrides," 69 J. App. Physics 6, pp. 3729–3732 (1991).

Sakaguchi et al., "ELTRAN® by Splitting Porous Si Layers," Proceedings of the 195th International SOI Symposium, vol 99–3 (1999), pp. 117–121.

Schäffler, "High–Mobility Si and Ge Structures," 12 Semiconductor Sci. Tech., pp. 1515–1549 (1997).

Sugimoto et al., "A 2V, 500 MHz and 3V, 920 MHz Low–Power Current–Mode 0.6 μm CMOS VCO Circuit," E82–C IEICE Trans Electron 7, pp. 1327–1329 (1999).

Ternent et al., "Metal Gate Strained Silicon MOSFETs for Microwave Integrated Circuits," IEEE (Oct. 2000), pp. 38–43.

Tsang et al., "Measurements of alloy composition and strain in thin $Ge_xSi_{1-x}$ layers," 75 J. App. Physics 12 (1994), pp. 8098–8108.

Tweet et al., "Factors determining the composition of strained GeSi layers grown with disilane and germane," 65 Applied Physics Letters 20, pp. 2579–2581 (1994).

Welser et al., "Electron Mobility Enhancement in Strained–Si N–Type Metal–Oxide–Semiconductor Field–Effect Transistors," 15 IEEE Electron Device Letters 3, pp. 100–102 (1994).

Welser et al., "Evidence of Real–Space Hot–Electron Transfer in High Mobility, Strained–Si Multilayer MOSFETs," 1993 IEEE IDEM Tech. Dig., pp. 545–548.

Welser et al., "NMOS and PMOS Transistors Fabricated in Strained Silicon/Relaxed Silicon–Germanium Structures," 1992 IEEE IDEM Tech. Dig., pp. 1000–1002.

Welser, "The Application of Strained Silicon/Relaxed Silicon Germanium Heterostructures to Metal–Oxide–Semiconductor Field–Effect Transistors," PhD Thesis, Stanford University, 1994, pp. 1–205.

Wolf et al., "Silicon Processing for the VLSI Era, vol. 1: Process Technology," Lattice Press, Sunset Beach, CA, 1986, pp. 384–386.

Xie et al., "Semiconductor Surface Roughness: Dependence on Sign and Magnitude of Bulk Strain," 73 Physical Review Letters 22, pp. 3006–3009 (1994).

Xie et al., "Very High Mobility Two–Dimensional Hole Gas in Si/GexSi1–x/Ge Structures Grown by Molecular Beam Epitaxy," 63 Applied Physics Letters 16, pp. 2263–2264 (1993).

Xie, "SiGe Field Effect Transistors," 25 Mat. Sci. & Engineering, pp. 89–121 (1999).

Yamagata et al., "Bonding, Splitting and Thinning by Porous Si in ELTRAN®; SOI–Epi Wafer™," Mat. Research Soc'y Symp. Proc., vol. 681E, pp. I8.2.1–I8.2.10 (2001).

* cited by examiner

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–33 is confirmed.

Claim 34 is determined to be patentable as amended.

Claims 35–39, dependent on an amended claim, are determined to be patentable.

34. A method of processing a semiconductor structure comprising:

providing a first glass substrate;

providing a layered structure including a second substrate having an epitaxial layer provided thereon, said epitaxial layer having an in-plane lattice constant that is different from that of said second substrate and a threading dislocation density of less than $10^7$ cm$^{-2}$;

bonding said first substrate to said [epitaxial layer] *layered structure*; and removing said second substrate.

\* \* \* \* \*